(12) United States Patent
Lu et al.

(10) Patent No.: US 11,536,763 B2
(45) Date of Patent: Dec. 27, 2022

(54) METHOD AND APPARATUS FOR DETERMINING ELECTRICAL CHARACTERISTICS OF ORGANIC TRANSISTOR, AND STORAGE MEDIUM

(71) Applicants: BOE TECHNOLOGY GROUP CO., LTD., Beijing (CN); BEIHANG UNIVERSITY, Beijing (CN)

(72) Inventors: Jiangnan Lu, Beijing (CN); Hongge Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 808 days.

(21) Appl. No.: 16/344,634

(22) PCT Filed: Aug. 31, 2018

(86) PCT No.: PCT/CN2018/103616
§ 371 (c)(1),
(2) Date: Apr. 24, 2019

(87) PCT Pub. No.: WO2019/100802
PCT Pub. Date: May 31, 2019

(65) Prior Publication Data
US 2021/0356510 A1 Nov. 18, 2021

(30) Foreign Application Priority Data
Nov. 24, 2017 (CN) .......................... 201711188996.3

(51) Int. Cl.
G01R 31/26 (2020.01)
(52) U.S. Cl.
CPC .............................. *G01R 31/2621* (2013.01)

(58) Field of Classification Search
CPC .................................................. G01R 31/2621
(Continued)

(56) References Cited

U.S. PATENT DOCUMENTS

2005/0095728 A1* 5/2005 Hillard ............... G01R 31/2648
438/14
2006/0095876 A1 5/2006 Chandra
(Continued)

FOREIGN PATENT DOCUMENTS

CN 102663200 A 9/2012
CN 103838905 A 6/2014
(Continued)

OTHER PUBLICATIONS

Wang Run-Sheng et al; "The Theory of Physical Doping in Organic Semiconductor", Acta Physica Sinica, vol. 58, No. 11, Nov. 2009, 19 pages.
(Continued)

*Primary Examiner* — Ricky Go

(57) ABSTRACT

Disclosed are a method and apparatus for determining electrical characteristics of a transistor, and a computer-readable storage medium. The method for determining electrical characteristics of a transistor includes: determining mobility characteristics of carriers in channels of the transistor at a transistor operating temperature condition; and determining electrical characteristics of the transistor based on the mobility characteristics of the carriers, semiconductor material properties of the transistor, and structural features of the transistor.

15 Claims, 10 Drawing Sheets

(58) Field of Classification Search
USPC .......................................................... 702/57
See application file for complete search history.

(56) References Cited

U.S. PATENT DOCUMENTS

| | | | | |
|---|---|---|---|---|
| 2006/0261840 | A1* | 11/2006 | Hoon ................. | G01R 31/2621 |
| | | | | 324/762.03 |
| 2007/0150206 | A1* | 6/2007 | Iwaki .................. | C07D 487/22 |
| | | | | 702/22 |
| 2017/0033205 | A1 | 2/2017 | Yamazaki et al. | |

FOREIGN PATENT DOCUMENTS

| | | |
|---|---|---|
| CN | 102915394 B | 4/2015 |
| CN | 105468828 A | 4/2016 |
| CN | 106156388 A | 11/2016 |
| CN | 108226735 A | 6/2018 |

OTHER PUBLICATIONS

The First Chinese Office Action dated Oct. 31, 2019; Appln. No. 201711188996.3.
The International Search Report and Written Opinion dated Nov. 23, 2018; PCT/CN2018/103616.

* cited by examiner

METHOD AND APPARATUS FOR DETERMINING ELECTRICAL CHARACTERISTICS OF ORGANIC TRANSISTOR, AND STORAGE MEDIUM

CROSS-REFERENCE TO RELATED APPLICATIONS

The present application claims the priority of Chinese patent application No.: 201711188996.3 filed on Nov. 24, 2017, which is incorporated by reference herein in its entirety as part of the present application.

TECHNICAL FIELD

The present disclosure relates to a method and apparatus for determining electrical characteristics of a transistor, and a computer-readable storage medium having stored thereon instructions that can cause the method to be performed.

BACKGROUND

Organic semiconductor devices have the advantages of flexibility, transparency, low cost, and large-area manufacturing, and have broad application prospects. After several years of development, the theory of organic semiconductor devices has gradually matured and the performance of devices has been continuously improved. Low-end application products such as flexible, transparent, printable manufactured RF (Radio Frequency) electronic tags have begun to appear in foreign countries. Thin film transistors based on organic semiconductors are common components in flexible, transparent electronic circuits. As the performance of organic semiconductor-based thin film transistors continues to increase, the mobility ratio can reach 0.1 to 10 cm$^2$/Vs, and the operating voltage can be reduced to about 5V.

In general, before an integrated circuit is fabricated, the feasibility for designing the circuit is verified using a computer simulation method. This requires a device model to be built for the device, to simulate electrical behaviors of the device in the circuit. Device testers have completed many simulation models for thin film transistors.

SUMMARY

To this end, the present disclosure provides a method for determining electrical characteristics of a transistor according to material and structural characteristics of the transistor, that is, mobility characteristics of carriers in channels of the transistor at a normal temperature are determined based on material characteristics of the transistor, and electrical characteristics of the transistor are determined according to the carrier mobility characteristics and the structure of the transistor.

According to an aspect of the present disclosure, there is provided a method for determining electrical characteristics of a transistor, comprising: determining mobility characteristics of carriers in channels of the transistor at a transistor operating temperature condition; and determining electrical characteristics of the transistor based on the mobility characteristics of the carriers, semiconductor material properties of the transistor, and structural features of the transistor.

In an embodiment, determining mobility characteristics of carriers in channels of the transistor at a transistor operating temperature condition comprises: determining a static carrier mobility ratio in the transistor based on material properties of the transistor under the transistor operating temperature condition; and determining a field effect mobility ratio of the carriers based on the static carrier mobility ratio and an activation energy of material of the transistor.

In an embodiment, the field effect mobility ratio of the carriers is:

$$\mu(T) = \mu_0 \times \exp\left[-E_a\left(\frac{1}{k_B T} - \frac{1}{k_B T_0}\right)\right]$$

where $\mu_0$ is the static carrier mobility ratio, and $E_a$ is the activation energy.

In an embodiment, determining mobility characteristics of carriers in channels of the transistor at a transistor operating temperature condition comprises: determining a distribution of trap states within an energy gap in semiconductor material of the transistor at the transistor operating temperature condition; and determining a carrier concentration in channels of the transistor based on the distribution of trap states within the energy gap.

In an embodiment, the distribution of trap states within the energy gap satisfies a Gaussian distribution, and the carrier concentration in channels of the transistor is:

$$n = \int_{-\infty}^{+\infty} \frac{N}{\sqrt{2\pi\sigma^2}} \exp\left(\frac{-E^2}{2\sigma^2}\right) f(E) dE$$

where N is a total density of trap states within the energy gap, $\sigma$ is an energy disorder parameter of material of the transistor, E is an energy of energy carriers, and f(E) is an occupancy probability of the carriers at the energy E.

In an embodiment, the occupancy probability of the carriers at the energy E is in conformity with a Fermi-Dirac distribution, the carrier concentration in channels of the transistor is:

$$n = n_0 \exp\left[\frac{q(\varphi - V_{ch})}{k_B T}\right]$$

where $n_0$ is a carrier concentration away from contact surface of a semiconductor insulating layer, $\varphi$ is a potential distribution perpendicular to a channel direction, $V_{ch}$ is a potential distribution along the channel direction, $k_B$ is a Boltzmann constant, and T is a temperature.

In an embodiment, determining electrical characteristics of the transistor based on the mobility characteristics of the carriers, semiconductor material properties of the transistor, and structural features of the transistor comprises: determining an electric field distribution of the transistor perpendicular to a channel direction according to the carrier concentration; and determining a surface charge distribution in channels of the transistor according to the electric field distribution of the transistor perpendicular to the channel direction.

In an embodiment, the electric field distribution of the transistor perpendicular to the channel direction is:

$$F_x(\varphi_x, V_{ch}) = \sqrt{\frac{2k_B T}{\varepsilon_x} n_0} \left[\exp\left(-\frac{qV_{ch}}{k_B T}\right)\left(\exp\left(\frac{q\varphi_x}{k_B T}\right) - 1\right)\right]^{1/2}$$

where $k_B$ is a Boltzmann constant, T is a temperature, $\varepsilon_s$ is a dielectric constant of a semiconductor layer, q is an electric quantity of a unit charge, $\varphi_x$ is a potential distribution perpendicular to a channel direction, and $V_{ch}$ is a potential distribution along the channel direction.

In an embodiment, the charge distribution in channels of the transistor is:

$$Q_s = -\varepsilon_s F_s = -\sqrt{2k_B T \varepsilon_s n_0} \left[ \exp\left(-\frac{qV_{ch}}{k_B T}\right)\left(\exp\left(\frac{q\varphi_s}{k_B T}\right) - 1\right) \right]^{1/2}$$

In an embodiment, determining electrical characteristics of the transistor based on the mobility characteristics of the carriers, semiconductor material properties of the transistor, and structural features of the transistor comprises: determining a relationship of how a drain current of the transistor changes as a function of a gate voltage according to the mobility of the carriers, the charge distribution in channels of the transistor, and the structural features of the transistor.

In an embodiment, the structural features of the transistor comprise a channel width and a channel length of the transistor, the relationship of how the drain current of the transistor changes as a function of the gate voltage is:

$$I_{ds} = \frac{W}{L} \int_{V_s}^{V_d} \mu |Q_s| dV_{ch} = \frac{W}{L} \mu(\tau) \left[ -\frac{2k_B T}{q}(Q_{Sd} - Q_{Ss}) + \frac{1}{2C_{ox}}(Q_{Sd}^2 - Q_{Ss}^2) \right]$$

where W is a channel width, L is a channel length, $V_d$ is a drain voltage, and $V_s$ is a source voltage, and where $Q_{Ss} = -C_{ox}(V_g - V_{fb} - V_s)$, $Q_{Sd} = -C_{ox}(V_g - V_{fb} - V_d)$, $C_{ox}$ is a capacitance per unit area of the insulating layer of the transistor, and $V_{fb}$ is a flat band voltage.

In an embodiment, determining electrical characteristics of the transistor based on the mobility characteristics of the carriers, semiconductor material properties of the transistor, and structural features of the transistor further comprises: when the gate voltage of the transistor is in a sub-threshold zone, a relationship of how the drain current of the transistor changes as a function of the gate voltage of the transistor is determined according to contact resistances among a source, a drain, and semiconductor material of the transistor.

In an embodiment, when the gate voltage of the transistor is in the sub-threshold zone, the relationship of the drain current of the transistor changes as a function of the gate voltage of the transistor is:

$$I_{sub} = \frac{W}{L} C_{ox} \mu_{sub} \left(\frac{k_B T}{q}\right)^2 \exp\frac{q(V_{gs} - V_{fb})}{\eta k_B T} \left(1 - \exp\frac{-qV_{ds}}{\eta k_B T}\right)$$

where $\mu_{sub}$ is a carrier mobility ratio in the sub-threshold zone of the transistor.

In an embodiment, the semiconductor material of the transistor is organic material.

In an embodiment, the transistor is a coplanar thin film transistor.

According to another aspect of the present disclosure, there is provided a computer-readable storage medium having stored thereon instructions that, when executed by a computer, cause a computer to perform the method as described above.

According to another aspect of the present disclosure, there is provided an apparatus for determining electrical characteristics of a transistor, the apparatus comprising: an input module configured to receive an input of parameters for determining electrical characteristics of the transistor, wherein the parameters including semiconductor material properties of the transistor, structural features of the transistor, and a temperature; a memory having stored thereon processor-readable instructions; a processor configured to, when executing the instructions, cause the apparatus to perform the method described above and obtain a determination result of electrical characteristics of the transistor; and an output module configured to output the determination result of electrical characteristics of the transistor.

By means of the method for determining electrical characteristics of the transistor and the computer-readable storage medium having stored thereon instructions that cause said method to be performed, electrical characteristics of the transistor can be determined based on material properties, structural features and operating temperatures of the transistor, thereby before the integrated circuit is fabricated, electrical characteristics of the circuit can be determined and feasibility of the circuit can be determined.

BRIEF DESCRIPTION OF THE DRAWINGS

In order to more clearly illustrate the technical solutions of the embodiments of the present disclosure, hereinafter, the drawings necessary for illustration of the embodiments of the present application will be introduced briefly. Obviously, the drawings described below are only some embodiments of the present disclosure. It is possible for a person of ordinary skill in the art to obtain other drawings based on these drawings without paying creative efforts. The following drawings are focused on showing the subject matter of the present disclosure, not schematically scaled by actual dimensions.

DETAILED DESCRIPTION OF THE EMBODIMENTS

Figure 1:
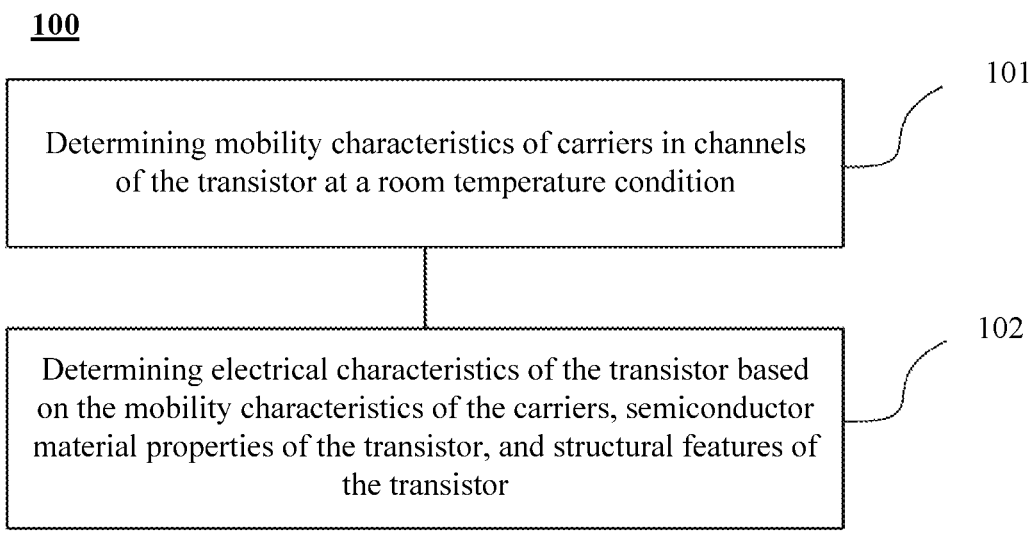
FIG. 1 shows a flowchart of a method for determining electrical characteristics of a transistor according to an embodiment of the present disclosure.

Hereinafter, the technical solutions in the embodiments of the present disclosure will be described in a clear and complete way with reference to the accompanying drawings. Obviously, these described embodiments are merely parts of the embodiments of the present disclosure, rather than all of the embodiments thereof. Other embodiments obtained by a person of ordinary skill in the art based on the embodiments of the present disclosure without paying creative effort all fall into the protection scope of the present disclosure.

Words and expressions such as "first", "second" and the like used in the present disclosure do not denote any sequence, quantity or significance, but distinguish different components. Likewise, words such as "include", "comprise" and the like refer to that an element or an article before this word contains all the elements or articles listed thereinafter or alternatives thereof, without excluding other elements or articles. Words such as "connected", "connecting" and the like are not restricted to physical or mechanical connections, but may include electrical connections, regardless of direct or indirect connections. Words such as "up", "below", "left", "right", etc., are only used to denote relative positional relationship, once an absolute position of the described object changes, the relative positional relationship may probably change correspondingly.

At present, the models for determining electrical characteristics of transistors, especially devices with respect to organic thin film transistor, are mainly divided into two categories. One category is obtained by making a simple correction to the carrier mobility ratio model and the transistor threshold voltage, etc. based on a conventional MOS transistor model. However, since structure and material of the MOS transistor are greatly different from those of the organic thin film transistor, the model obtained by making correction based on the MOS transistor contains a large number of fitting parameters, which increases complexity of the model and workload of the calculation. The other category of model is an organic thin film transistor model based on Variable. Range Hopping theory in view of the physical properties of organic semiconductor per se. However, this theory is only applicable to low temperature conditions (such as T<250K), and is not suitable for display devices where the operating temperature is room temperature and above (taking Kelvin temperature as an example, the operating temperature of the transistor is about 290K to 350K).

In view of the above problems, the present disclosure provides a method for determining electrical characteristics of a transistor applied to a display device having an operating temperature of room temperature and above. The semiconductor material of the transistor referred to herein is organic material. With the method provided by the present disclosure, the electrical characteristics of the transistor can be determined more accurately and simply.

FIG. 1 shows a flowchart of a method for determining electrical characteristics of a transistor according to the present disclosure. The method comprises:

Step 101, determining mobility characteristics of carriers in channels of the transistor at an operating temperature condition of the transistor. Herein, mobility characteristics of carriers in channels of the transistor include a field effect mobility ratio and a carrier concentration of the carriers in channels.

Step 102, determining electrical characteristics of the transistor based on the mobility characteristics of the carriers, semiconductor material properties of the transistor, and structural features of the transistor. Herein, electrical characteristics of the transistor include a charge distribution and an electric field distribution in channels of the transistor, and a relationship of how a drain current of the transistor changes as a function of a gate voltage, and so on.

The method for determining electrical characteristics of a transistor will be described in detail below with reference to FIGS. 2 to 3.

Figure 2:
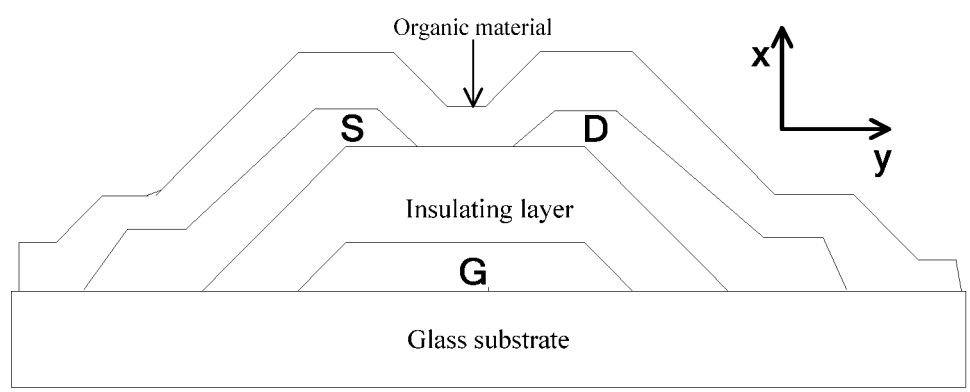
FIG. 2 is device structure of an organic thin film transistor according to the present disclosure.

FIG. 2 is device structure of an organic thin film transistor according to an embodiment of the present disclosure. The organic thin film transistor in the example shown in FIG. 2 is of a bottom gate bottom contact structure. However, this is not intended to limit the scope of the present disclosure. In fact, the method of the present disclosure may be applied to any coplanar organic thin film transistor. In the coplanar organic thin film transistor, a gate electrode (G), a source electrode (S), and a drain electrode (D) are on the same side of a semiconductor layer. The method according to an embodiment of the present disclosure may be applied to an organic thin film transistor of a bottom gate bottom contact structure, a bottom gate top contact structure, a top gate top contact structure, or a top gate bottom contact structure. The transistor shown in FIG. 2 is arranged with a glass substrate, a gate electrode G, an insulating layer, a source electrode S, a drain electrode D, and semiconductor material in order from bottom to top. The semiconductor material may be organic material. The organic material used herein may be pentacene, tetracene, pentathiophene, quaterphenyl, quinquephenyl, sexiphenyl etc., or other derivatives. In addition, an x direction and a y direction are also shown in FIG. 1. In FIG. 1 and the following description, the x direction refers to the direction perpendicular to channels of the transistor, and the y direction refers to the direction parallel to channel of the transistor.

Taking the organic small molecule pentacene as an example, the pentacene itself is of disordered structure, the single pentacene small molecule itself has a lot of defects, and the molecules are combined by weak van der Waals force, so there is no way to form a continuous energy band like crystalline silicon, energy distribution is in the form of a separate energy state, that is, a trap state, and carriers perform charge transfer in the form of hopping among respective trap states.

According to the above transistor structure and carrier mobility theory, in some embodiments, step 102 further comprises: determining a static carrier mobility ratio in the transistor based on material properties of the transistor under the transistor operating temperature condition; and determining a field effect mobility ratio of the carriers based on the static carrier mobility ratio and an activation energy of material of the transistor.

For example, according to an embodiment of the present disclosure, under the transistor operating temperature condition, the field mobility ratio of the carriers in channels of the transistor satisfies Equation (1):

$$\mu(T) = \mu_0 \times \exp\left[-E_a\left(\frac{1}{k_B T} - \frac{1}{k_B T_0}\right)\right] \quad (1)$$

where $\mu_0$ is the static carrier mobility ratio, and $E_a$ is the activation energy.

In some embodiments, the activation energy may be determined by Equation (2):

$$E_a = \left[\frac{3}{40}C - \frac{1}{15}Cln\left(\frac{n}{N}\right)\right]\sigma \quad (2)$$

where n represents a carrier concentration in channels of the transistor, N represents a total density of trap states within the energy gap, σ represents an energy disorder degree of semiconductor material, and C is a parameter related to a local state radius of active layer material of the transistor.

According to the method disclosed in the present application, the field effect mobility ratio of the carriers in the transistor at the transistor operating temperature can be determined according to the semiconductor material properties of the transistor.

In some embodiments, step 102 further comprises: determining a distribution of trap states within an energy gap in semiconductor material of the transistor at the transistor operating temperature condition, and determining a carrier concentration in channels of the transistor based on the distribution of trap states within the energy gap.

Energy band structure of semiconductor material in a transistor according to an embodiment of the present disclosure, and the method for determining a carrier concentration in a transistor based on the energy band structure will be described below with reference to FIG. 3.

Figure 3:
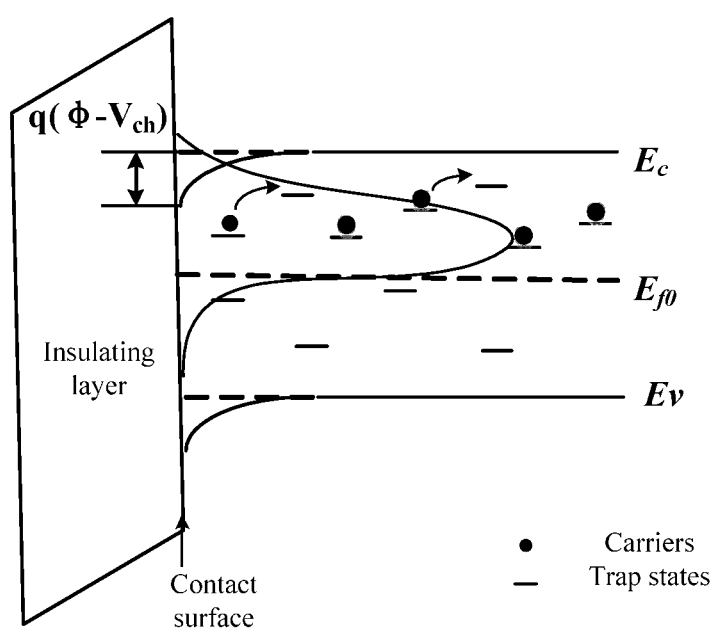
FIG. 3 shows energy band structure at a contact surface between the insulating layer and the semiconductor material in the transistor.

FIG. 3 shows energy band structure at a contact surface between the insulating layer and the semiconductor material in the transistor. As shown in FIG. 3, the left side of the contact surface is an insulating layer, and the right side thereof is a semiconductor material layer. In the semiconductor material layer, the upper $E_c$ is a conduction band energy level, and the lower $E_v$ is a valence band energy level. The dash line between the conduction band energy level $E_c$ and the valence band energy level $E_v$ is a separate trap state, wherein a deep trap state is near the middle and a shallow trap state is near the conduction band or the valence band. Under low temperature conditions, the deep trap state is gradually occupied as the temperature increases. When the temperature rises to the transistor operating temperature, the carriers mainly transfer charge in the form of hopping among the shallow trap states. In some embodiments, a Gaussian distribution can be used to simulate a distribution of trap states in the semiconductor material within a range of the transistor operating temperature. That is to say, under the transistor operating temperature condition, the Gaussian disorder hopping theory can be used to determine the charge transfer in the semiconductor material. Based on the Gaussian disorder hopping theory, the carrier concentration in channels of the transistor satisfies Equation (3):

$$n = \int_{-\infty}^{+\infty} \frac{N}{\sqrt{2\pi\sigma^2}} \exp\left(\frac{-E^2}{2\sigma^2}\right) f(E) dE \quad (3)$$

where n represents a carrier concentration in channels of the transistor, N represents a total density of trap states within the energy gap, f(E) represents an occupancy probability of the carriers at the energy E, σ represents an energy disorder degree of semiconductor material, the higher the structure disorder degree of the semiconductor material is, the higher the value of σ is.

In some embodiments, the occupancy probability of the carriers at energy E can be approximated by a Fermi-Dirac distribution, then the carrier concentration in channels of the transistor satisfies Equation (4):

$$n = \int_{-\infty}^{+\infty} \frac{N}{\sqrt{2\pi\sigma^2}} \exp\left(\frac{-E^2}{2\sigma^2}\right) f(E) dE \approx n_0 \exp\left[\frac{q(\varphi - V_{ch})}{k_B T}\right] \quad (4)$$

where φ is a potential distribution perpendicular to a channel direction (i.e., the x direction), $V_{ch}$ is a potential distribution along the channel direction (i.e., the y direction), $k_B$ is a Boltzmann constant, and T is a temperature. In some examples, the value of T is 300K under the transistor operating temperature condition. When the transistor operating temperature changes, the value of the temperature T in Equation (4) can be changed to a corresponding transistor operating temperature.

In some embodiments, Step 104 further comprises: determining an electric field distribution of the transistor perpendicular to a channel direction according to the carrier concentration; and determining a surface charge distribution in channels of the transistor according to the electric field distribution of the transistor perpendicular to the channel direction.

For example, based on the concentration of carriers in channels of the transistor under the transistor operating temperature condition determined by Equation (4), the electric field $F_x$ (Equation (6)) in the x direction in channels can be determined according to a Poisson equation (Equation (5)):

$$\frac{d^2\varphi}{dx^2} = -\frac{dF_x}{dx} = -\frac{qn}{\varepsilon_s} \quad (5)$$

$$F_x(\varphi_x, V_{ch}) = \sqrt{\frac{2k_B T}{\varepsilon_x} n_0 \left[\exp\left(-\frac{qV_{ch}}{k_B T}\right)\left(\exp\left(\frac{q\varphi_x}{k_B T}\right) - 1\right)\right]^{1/2}} \quad (6)$$

where $k_B$ is a Boltzmann constant, T is a temperature, $\varepsilon_s$ is a dielectric constant of a semiconductor layer, q is an electric quantity of a unit charge, $\varphi_x$ is a potential distribution perpendicular to a channel direction, and $V_{ch}$ is a potential distribution along the channel direction.

According to Equation (6), the electric field distribution $F_s$ of the semiconductor-insulating layer contact surface in the transistor can be determined, as shown in Equation (7):

$$F_s = F(x=0) \quad (7)$$

In some embodiments, Step 104 further comprises: determining an electric field distribution of the transistor perpendicular to a channel direction according to the carrier concentration; and determining a surface charge distribution in channels of the transistor according to the electric field distribution of the transistor perpendicular to the channel direction.

For example, based on the Gauss theorem and the electric field distribution of the semiconductor-insulating layer contact surface in channels of the transistor, the charge distribution in channels of the transistor can be determined based on Equation (8):

$$Q_s = -\varepsilon_s F_s = -\sqrt{2k_B T \varepsilon_s n_0} \left[\exp\left(-\frac{qV_{ch}}{k_B T}\right)\left(\exp\left(\frac{q\varphi_s}{k_B T}\right) - 1\right)\right]^{1/2} \quad (8)$$

According to the method disclosed in the present application, electrical characteristics in channels of the transistor can be determined based on the mobility characteristics of the transistor carriers at the operating temperature.

In some embodiments, Step 104 further comprises: determining a relationship of how a drain current of the transistor changes as a function of a gate voltage according to the mobility ratio of the carriers, the charge distribution in channels of the transistor, and the structural features of the transistor.

According to gradual channel approximation theory of transistors, when the gate voltage of the transistor is in a linear zone and a saturation zone, the current $I_{above}$ in channels of the transistor can be determined by Equation (9):

$$I_{above} = \frac{W}{L} \int_{V_s}^{V_d} \mu |Q_S| dV_{ch} \qquad (9)$$

where W is a channel width, L is a channel length, $V_d$ is a drain voltage, and $V_s$ is a source voltage.

Based on Equations (1) to (9), it can be determined that the relationship of how the drain current $I_{above}$ of the transistor changes as a function of the gate voltage $V_g$ is:

$$I_{above} = \frac{W}{L} \int_{V_s}^{V_d} \mu |Q_S| dV_{ch} = \qquad (10)$$

$$\frac{W}{L} \mu(T) \left[ -\frac{2k_B T}{q} (Q_{Sd} - Q_{Ss}) + \frac{1}{2C_{ox}} (Q_{Sd}^2 - Q_{Ss}^2) \right]$$

where $Q_{Ss} = -C_{ox}(V_g - V_{fb} - V_s)$, $Q_{Sd} = -C_{ox}(V_g - V_{fb} - V_d)$, $C_{ox}$ is a capacitance per unit area of the insulating layer of the transistor, and $V_{fb}$ is a flat band voltage.

In some embodiments, Step 804 further comprises: when the gate voltage of the transistor is in a sub-threshold zone, that is, when the gate voltage of the transistor is below a threshold voltage but there is still a small current flowing through the device, determining a relationship of how the drain current of the transistor changes as a function of the gate voltage of the transistor according to contact resistances among a source, a drain, and semiconductor material of the transistor.

For example, taking the thin film transistor having a bottom gate structure as an example, when the gate voltage of the transistor is in the sub-threshold zone, the relationship of the drain current $I_{ds}$ of the transistor in the sub-threshold zone changes as a function of the gate voltage $V_g$ can be determined by using Equation (11):

$$I_{sub} = \frac{W}{L} C_{ox} \mu_{sub} \left( \frac{k_B T}{q} \right)^2 \exp\frac{q(V_{gs} - V_{fb})}{\eta k_B T} \left( 1 - \exp\frac{-qV_{ds}}{\eta k_B T} \right) \qquad (11)$$

where $\mu_{sub}$ is a carrier mobility ratio in the sub-threshold zone.

For all operating zones of the transistor, the relationship of how the drain current $I_{ds}$ changes as a function of the gate voltage can be expressed by Equation (12):

$$I_{ds} = I_{above} \times \frac{1}{2} \{1 - \tanh[B(V_{gs} - V_B)]\} + \qquad (12)$$

$$I_{sub} \times \frac{1}{2} \{1 + \tanh[B(V_{gs} - V_B)]\} + I_0$$

where B and $V_B$ are smoothing constants, and $I_0$ is a drain current when no voltage is applied to the transistor.

TABLE 1

| | | | | Model parameters | | | | | |
|---|---|---|---|---|---|---|---|---|---|
| W/L [μm/μm] | $C_{ox}$ [nF/cm$^2$] | $\mu_0$ [cm$^2$/(Vs)] | N [cm$^{-3}$] | n/N | σ [eV] | $V_{fb}$ [V] | T [k] | η | $\mu_{sub}$ [cm$^2$/(Vs)] |
| 80/5 | 70 | 2.5 | $10^{22}$ | 0.01 | $3k_B T$ | 4.5 | 300 | −12 | 0.065 |

By means of the method for determining electrical characteristics of the transistor provided by the present disclosure, electrical characteristics of the transistor can be determined based on material properties, structural features and operating temperatures of the transistor, thereby before the integrated circuit is fabricated, electrical characteristics of the circuit can be simulated and feasibility of the circuit can be determined.

Effectiveness of the above theory for determining electrical characteristics of the transistor can be verified experimentally. Table 1 shows structural characteristics parameters and material characteristics parameters of the transistor used for the experiments. In the following, FIGS. 4 to 8 show experimental results of the method for determining electrical characteristics of a transistor as previously described.

Figure 4:
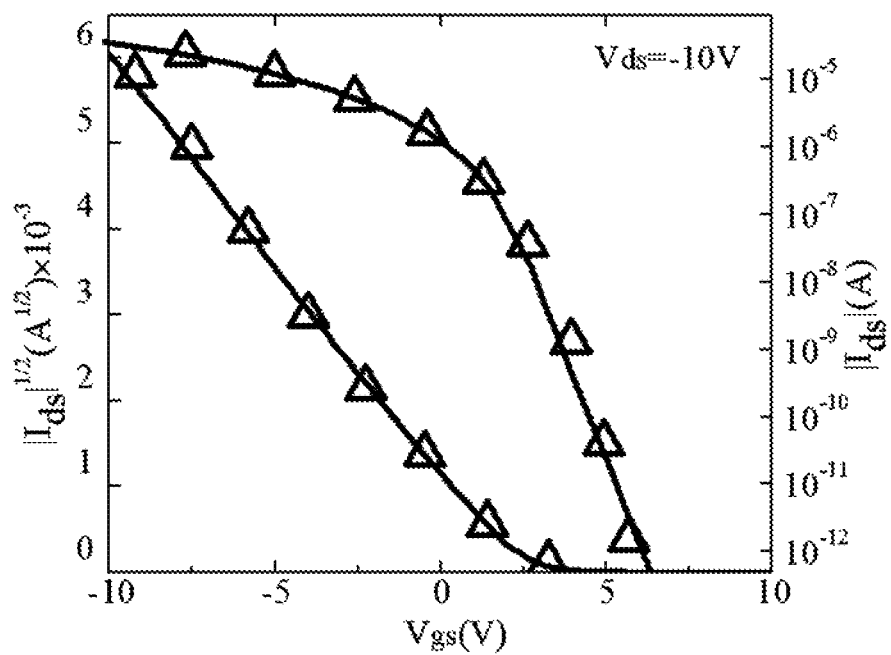
FIG. 4 shows a linear characteristic curve in the sub-threshold zone and a mobility characteristic curve under exponential coordinates of the transistor.

FIG. 4 shows a linear characteristic curve in the sub-threshold zone and a mobility characteristic curve under exponential coordinates of the transistor. The triangle in the figure is the experimentally measured data, and the curve is a curve drawn according to the above theory. It can be seen that the model fits well with experimental data from the sub-threshold zone to the saturation zone of the transistor.

Figure 5:
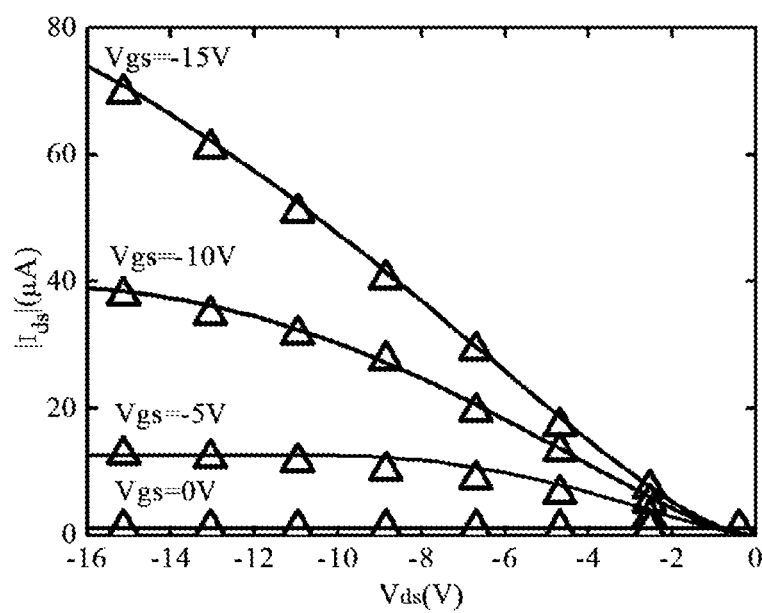
FIG. 5 shows an output characteristic curve of the transistor at different gate voltages.

FIG. 5 shows an output characteristic curve of the transistor at different gate voltage. The triangle in the figure is the experimentally measured data, and the curve is a curve drawn according to the above theory. It can be seen that, in the case of applying different gate voltages (as shown in the figure, the gate voltages are −15V, −10V, −5V, and 0V, respectively), the output characteristic curve is well fitted to the experimental results.

Figure 6:
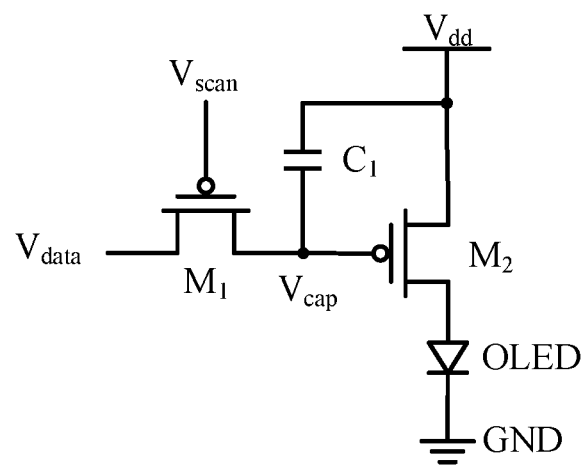
FIG. 6 shows an example of circuit for simulating and applying circuit characteristics of a transistor according to the present disclosure.

FIG. 6 shows an example of circuit for simulating and applying circuit characteristics of a transistor according to the present disclosure. The simulation circuit 500 includes a switching transistor M1, a driving transistor M2, a capacitor C1, and an organic light emitting diode OLED. In some embodiments, the switching transistor and driving transistor in the simulation circuit 500 are replaced with transistor models according to the present disclosure to simulate the driving current of the OLED.

Table 2 shows structural characteristics parameters and material characteristics parameters of the transistor in the simulation circuit shown in FIG. 6.

TABLE 2

Simulation parameters of AMOLED pixel driving circuit

| Parameter | Value |
|---|---|
| (W/L)$_{Sw-OTFT}$ | 80/5 μm/μm |
| (W/L)$_{Dr-OTFT}$ | 80/5 μm/μm |
| $V_{Select-High}$(V) | +5 |

TABLE 2-continued

Simulation parameters of AMOLED pixel driving circuit

| Parameter | Value |
|---|---|
| $V_{Select-low}(V)$ | −5 |
| Capacitance C1(pf) | 1 | where $(W/L)_{Sw\text{-}OTFT}$ is a channel width-to-length ratio of the switching transistor M1, $(W/L)_{Dr\text{-}OTFT}$ is a channel width-to-length ratio of the driving transistor M2, $V_{Select\text{-}High}$ and $V_{Select\text{-}low}$ respectively correspond to a high level and a low level of an input signal of a signal line $V_{scan}$.

Figure 7:
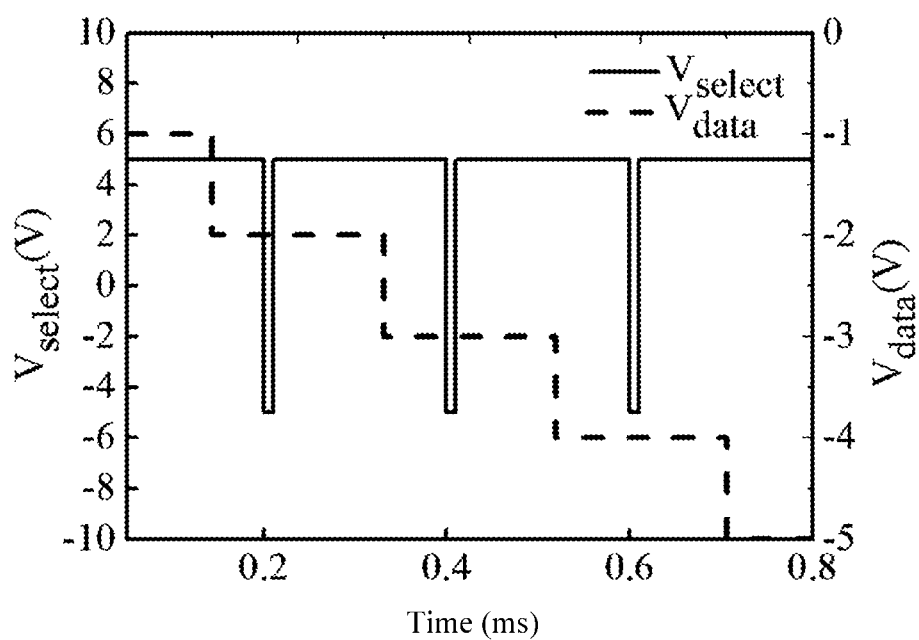
FIG. 7 shows a timing diagram of select voltages and data voltages of a simulation circuit according to an embodiment of the present disclosure.
Figure 8:
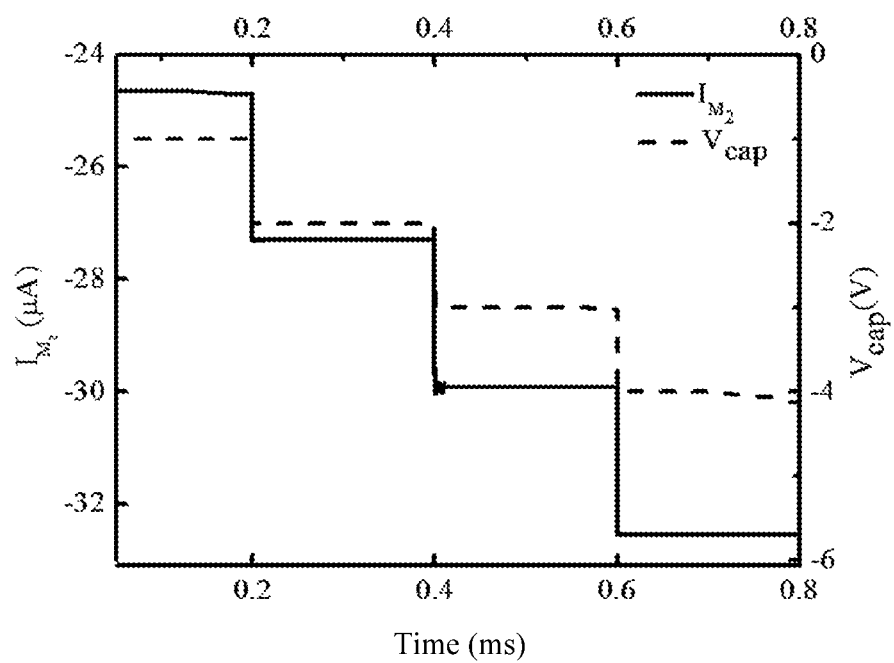
FIG. 8 shows simulation results of driving currents of the simulation circuit according to an embodiment of the present disclosure.

FIG. 7 shows a timing diagram of select voltages and data voltages of a simulation circuit according to the present disclosure. FIG. 8 shows simulation results of driving currents of the simulation circuit according to the present disclosure. According to the result shown in FIG. 8, the driving current outputted from the driving transistor M2 can drive the OLED to emit light. Thus, application of the transistor model according to the present disclosure in a simulation circuit is achieved.

Figure 9:
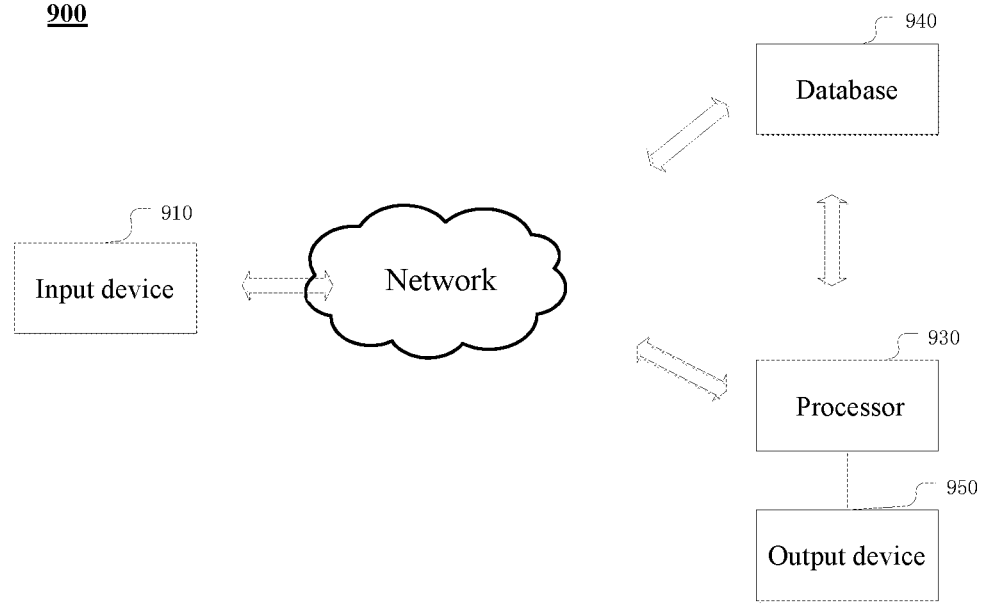
FIG. 9 shows a schematic diagram of a hardware system for determining electrical characteristics of a transistor according to an embodiment of the present disclosure.

FIG. 9 shows a schematic diagram of a hardware system for determining electrical characteristics of a transistor according to an embodiment of the present disclosure. In the following, a hardware system 900 for determining electrical characteristic's of a transistor may also be simply referred to as system 900. The system 900 here may be implemented by any device including a general purpose processor, a memory, and an input and output device, such as a computer, a notebook, a smart device, and the like.

The system 900 may include an input device 910, a network 920, a processor 930, a database 940, and an output device 950.

The input device 910 may be used to receive an input of parameters for determining electrical characteristics of the transistor. Here, the parameters for determining electrical characteristics of the transistor include structural parameters, material parameters, operating temperature of the transistor, and physical constants. For example, the structural parameters of the transistor include the channel width and the channel length of the transistor. The material parameters of the transistor include the capacitance per unit area of the insulating layer, the static mobility ratio of the carriers, the total density of trap states in the energy gap of the semiconductor material, the energy disorder parameter of the semiconductor material, the flat band voltage of the transistor, and the carrier mobility ratio in the sub-threshold zone, and so on. The physical constants include the unit charge electric quantity, the Boltzmann constant, and the like. The input device 910 may be any common input device of an arbitrary electronic device, such as a mouse, a keyboard, a touch pad, and the like.

The network 920 is configured to receive and transmit information among respective parts of the system 900. The network 920 may be a single network or a combination of multiple different networks. For example, the network 920 may be a local area network (LAN), a wide area network (WAN), a public network, a private network, a proprietary network, a public switched telephone network (PSTN), Internet, a wireless network, a virtual network, or any combination of the above-mentioned networks. The network 920 may also include multiple network access points, such as wired or wireless access points, like routers/switches and base stations, through which any data source can make access to the network 920 and send information over the network 920. For example, the network 920 may be an industrial Ethernet, a mobile communication network. An access mode of the network 920 may be wired or wireless. Wired access may be achieved by means of fiber optics or cables. Wireless access may be achieved via Bluetooth, wireless local area network (WLAN), Wi-Fi, WiMax, near field communication (NFC), ZigBee, mobile network (2G, 3G, 4G, 5G networks, etc.) or other connection modes.

In some embodiments, the network 920 may be omitted. For example, when an independent general purpose computer is used as the means of implementing the system 900, the input device 910, the processor 930, the database 940, and the output device 950 can be interconnected using a wired cable and perform data communication.

The processor 930 is configured to determine electrical characteristic of the transistor based on parameters for determining electrical characteristics of the transistor as received by the input device 910. In some embodiments, the processor can derive electrical characteristics of a transistor by carrying out the method for determining electrical characteristics of a transistor as previously described.

The processor 930 may be a processor hardware device, or a cluster of processors. Individual processors within a cluster of processors may be connected over a wired or wireless network. A cluster of processors may be centralized, such as a data center. A cluster of processors may also be distributed, such as a distributed system. The processor 930 may be configured to collect information received by the input device 910, analyze and process the inputted information based on the database 940, generate output content and convert it into images and audio/text signals so as to transfer to the output device 950. As shown in FIG. 9, the database 940 may be independent and directly connected to the network 920. The processor 930, or other parts of the system 900 may directly access the database 940 over the network 920.

The database 940 is configured to store various data files for use in computer processing and/or communication in the system 900. For example, the database 940 can store data of transistor parameters received by the input device 910, intermediate data and/or final results generated by the processor 930 from analysis and processing of the above parameters, output data generated from the parameters described above, and the like. The database 940 may use various storage devices such as a hard disk, a solid state storage device, an optical disk, and the like. In some embodiments, the database 940 may also store other data utilized by the processor 930. For example, the formulas or rules that the server 930 needs to use in analyzing and processing the above parameters, the criteria or thresholds on which the determination is made, and the like.

The output device 950 may be based on output content generated by the processor. The output device 950 can output a processing result of the processor in various forms such as an image, a text, a sound, an electric signal, and the like. For example, the output device may be a display screen.

By using the system for determining electrical characteristics of a transistor provided by the present disclosure, electrical characteristics of the transistor can be determined based on material characteristics, structural characteristics and operating temperatures of the transistor, thereby before the integrated circuit is fabricated, electrical characteristics of the circuit can be simulated and feasibility of the circuit can be determined.

Figure 10:
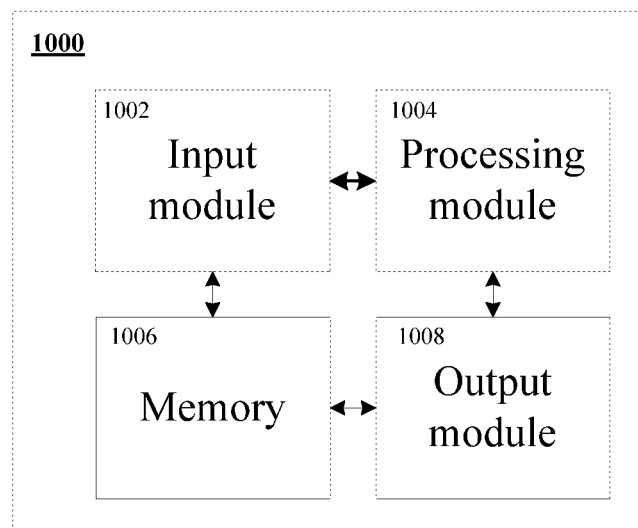
FIG. 10 shows a schematic block diagram of a processing apparatus for determining electrical characteristics of a transistor according to an embodiment of the present disclosure.

FIG. 10 shows a schematic block diagram of a processing apparatus for determining electrical characteristics of a transistor according to an embodiment of the present disclosure. The processing apparatus 1000 may include an input module 1002, a processing module 1004, a memory 1006, and an output module 1008.

The input module 1002 may be configured to receive an input of parameters for determining electrical characteristics of the transistor. Here, the parameters for determining electrical characteristics of the transistor include structural parameters, material parameters, operating temperature of the transistor, and physical constants. For example, the structural parameters of the transistor include the channel width and the channel length of the transistor. The material parameters of the transistor include the capacitance per unit area of the insulating layer, the static mobility ratio of the carriers, the total density of trap states in the energy gap of the semiconductor material, the energy disorder parameter of the semiconductor material, the flat band voltage of the transistor, and the carrier mobility ratio in the sub-threshold zone, and so on. The physical constants include unit charge electric quantity, the Boltzmann constant, and the like.

The memory 1006 may be configured to store input parameters received by the input module, intermediate data generated by the processing module, and/or output data generated by the processing module. The memory 1006 may also be configured to store processor-readable instructions. The memory 1006 may be implemented by any conventional storage medium such as a hard disk, a floppy disk, an optical disk, or the like.

The processing module 1004 is configured to determine electrical characteristics of the transistor based on parameters for determining electrical characteristics of the transistor as received by the input module 1002. The processing module 1004 may be configured to execute the instructions stored in the memory 1006 to cause the processing apparatus 1000 to perform the following steps:

determining mobility characteristics of carriers in channels of the transistor at a transistor operating temperature condition; and determining electrical characteristics of the transistor based on the mobility characteristics of the carriers, semiconductor material properties of the transistor, and structural features of the transistor.

In some embodiments, determining mobility characteristics of carriers in channels of the transistor at a transistor operating temperature condition comprises: determining a static carrier mobility ratio in the transistor based on material properties of the transistor under the transistor operating temperature condition; and determining a field effect mobility ratio of the carriers based on the static carrier mobility and an activation energy of material of the transistor.

Exemplarily, the field effect mobility ratio of the carriers is:

$$\mu(T) = \mu_0 \times \exp\left[-E_n\left(\frac{1}{k_BT} - \frac{1}{k_BT_0}\right)\right]$$

where $\mu_0$ is the static carrier mobility ratio, and $E_a$ is the activation energy.

In some embodiments, determining mobility characteristics of carriers in channels of the transistor at a transistor operating temperature condition comprises: determining a distribution of trap states within an energy gap in semiconductor material of the transistor at the transistor operating temperature condition; and determining a carrier concentration in channels of the transistor based on the distribution of trap states within the energy gap.

Exemplarily, the distribution of trap states within the energy gap satisfies a Gaussian distribution, and the carrier concentration in channels of the transistor is:

$$n = \int_{-\infty}^{+\infty} \frac{N}{\sqrt{2\pi\sigma^2}} \exp\left(\frac{-E^2}{2\sigma^2}\right) f(E) dE$$

where N is a total density of trap states within the energy gap, $\sigma$ is an energy disorder parameter of material of the transistor, E is an energy of energy carriers, and f(E) is an occupancy probability of the carriers at the energy E.

Exemplarily again, the occupancy probability of the carriers at the energy E is in conformity with a Fermi-Dirac distribution, the carrier concentration in channels of the transistor is:

$$n = n_0 \exp\left[\frac{q(\varphi - V_{ch})}{k_BT}\right]$$

where $n_0$ is a carrier concentration away from contact surface of a semiconductor insulating layer, $\varphi$ is a potential distribution perpendicular to a channel direction, $V_{ch}$ is a potential distribution along the channel direction, $k_B$ is a Boltzmann constant, and T is a temperature.

In some embodiments, wherein determining electrical characteristics of the transistor based on the mobility characteristics of the carriers, semiconductor material properties of the transistor, and structural features of the transistor comprises: determining an electric field distribution of the transistor perpendicular to a channel direction according to the carrier concentration; and determining a surface charge distribution in channels of the transistor according to the electric field distribution of the transistor perpendicular to the channel direction.

Exemplarily, the electric field distribution of the transistor perpendicular to the channel direction is:

$$F_x(\varphi_x, V_{ch}) = \sqrt{\frac{2k_BT}{\varepsilon_s}n_0} \left[\exp\left(-\frac{qV_{ch}}{k_BT}\right)\left(\exp\left(\frac{q\varphi_x}{k_BT}\right) - 1\right)\right]^{1/2}$$

where $k_B$ is a Boltzmann constant, T is a temperature, $\varepsilon_s$ is a dielectric constant of a semiconductor layer, q is an electric quantity of a unit charge, $\varphi_x$ is a potential distribution perpendicular to a channel direction, and $V_{ch}$ is a potential distribution along the channel direction.

Exemplarily, the charge distribution in channels of the transistor is:

$$Q_s = -\varepsilon_s F_s = -\sqrt{2k_BT\varepsilon_s n_0} \left[\exp\left(-\frac{qV_{ch}}{k_BT}\right)\left(\exp\left(\frac{q\varphi_x}{k_BT}\right) - 1\right)\right]^{1/2}$$

In some embodiments, determining electrical characteristics of the transistor based on the mobility characteristics of the carriers, semiconductor material properties of the transistor, and structural features of the transistor comprises: determining a relationship of how a drain current of the transistor changes as a function of a gate voltage according to the mobility ratio of the carriers, the charge distribution in channels of the transistor, and the structural features of the transistor.

Exemplarily, the structural features of the transistor comprise a channel width and a channel length of the transistor, the relationship of how the drain current of the transistor changes as a function of the gate voltage is:

$$I_{ds} = \frac{W}{L}\int_{V_s}^{V_d} \mu|Q_s|dV_{ch} = \frac{W}{L}\mu(T)\left[-\frac{2k_BT}{q}(Q_{Sd} - Q_{Ss}) + \frac{1}{2C_{ox}}(Q_{Sd}^2 - Q_{Ss}^2)\right]$$

where W is a channel width, L is a channel length, $V_d$ is a drain voltage, and $V_s$ is the source voltage, and where $Q_{Ss} = -C_{ox}(V_g - V_{fb} - V_s)$, $Q_{Sd} = -C_{ox}(V_g - V_{fb} - V_d)$, $C_{ox}$ is a capacitance per unit area of the insulating layer of the transistor, and $V_{fb}$ is a flat band voltage.

In some embodiments, when the gate voltage of the transistor is in a sub-threshold zone, a relationship of how the drain current of the transistor changes as a function of the gate voltage of the transistor is determined according to contact resistances among a source, a drain, and semiconductor material of the transistor.

Exemplarily, when the gate voltage of the transistor is in the sub-threshold zone, the relationship of how the drain current of the transistor changes as a function of the gate voltage of the transistor is:

$$I_{sub} = \frac{W}{L}C_{ox}\mu_{sub}\left(\frac{k_BT}{q}\right)^2 \exp\frac{q(V_{gs} - V_{fb})}{\eta k_BT}\left(1 - \exp\frac{-qV_{ds}}{\eta k_BT}\right)$$

where $\mu_{sub}$ is a carrier mobility ratio in the sub-threshold zone of the transistor.

The output module 1008 may be configured to output the determination result of electrical characteristics of the transistor. For example, the output module 1008 may output a relationship of how the drain current of the transistor changes as a function of the gate voltage. For another example, when the gate voltage of the transistor is given, the output module 1008 may output an output characteristic curve of the transistor according to the given gate voltage.

By means of the processor for determining electrical characteristics of the transistor provided by the present disclosure, electrical characteristics of the transistor can be determined based on material properties, structural features and operating temperatures of the transistor, thereby before the integrated circuit is fabricated, electrical characteristics of the circuit can be simulated and feasibility of the circuit can be determined.

Different aspects of the method for determining electrical characteristics of a transistor at an operating temperature and/or methods of implementing other steps by a program are briefed in the above. Program portions of the technology may be considered to be "product" or "article" that exists in the form of executable codes and/or related data, which are embodied or implemented by a computer-readable medium. A tangible, permanent storage medium may include internal memory or storage used by any computer, processor, or a similar device or associated module, such as, various semiconductor memories, tape drivers, disk drivers, or any similar device capable of providing storage functionality for software.

All software or parts of it may sometimes communicate over a network, such as Internet or other communication networks. Such communication can load software from one computer device or processor to another computer device or processor. For example, loading from a server or host computer to a hardware platform of computer environment, or other computer environment implementing the system, or a system having a similar function associated with providing information needed to determine electrical characteristics of the transistor at the operating temperature. Therefore, another medium capable of transmitting software elements can also be used as a physical connection between local devices, such as optical waves, electric waves, electromagnetic waves, etc., to be propagated through cables, optical cables, or air. Physical medium used for carrying the waves such as cables, wireless connections, or fiber optic cables can also be considered as medium for carrying the software. In usage herein, unless a tangible "storage" medium is defined, other terms referring to a computer or machine "readable medium" mean a medium that participates in execution of any instruction by the processor.

A computer-readable medium may take many forms, including tangible storage medium, carrier medium or physical transmission medium etc. Stable storage medium may include optical or magnetic disks, as well as storage systems used in other computers or similar devices and capable of implementing the system components described in the drawings. Unstable storage medium may include dynamic memory, such as main memory of a computer platform. Tangible transmission medium may include coaxial cable, copper cable, and optical fiber, such as lines forming a bus within a computer system. Carrier transmission medium can transmit an electrical signal, an electromagnetic signal, an acoustic wave signal, or an optical wave signal. These signals can be generated by methods of radio frequency or infrared data communication. Typical computer-readable medium includes hard disk, floppy disk, magnetic tape, any other magnetic medium; CD-ROM, DVD, DVD-ROM, any other optical medium; perforated card, any other physical storage medium containing an aperture pattern; RAM, PROM, EPROM, FLASH-EPROM, any other memory slice or tape; carrier for transmitting data or instructions, cable, or connection devices for transmitting carrier, any other program codes and/or data that can be read by a computer. Many of these forms of computer-readable medium appear in the process during which the processor executes instructions and passes one or more results.

The "module" as used herein refers to logic embodied in hardware or firmware, or to a collection of software instructions. The "module" described herein may be implemented by a software and/or hardware module, or may be stored in any type of computer-readable non-transitory medium or other storage device. In some embodiments, a software module may be compiled and linked into an executable program. Obviously, the software module referred to herein can respond to information from itself or from other modules, and/or can respond to detected events or interrupts. The software module may be provided on a computer-readable medium, and may be configured for executing operations on computing devices (e.g., processor 220). The computer-readable medium referred to herein may be compact disc, digital video disc, flash disc, magnetic disc, or any other tangible medium. The software module may be obtained by way of digital download (the digital download may also include data stored in a compressed or installable package that needs decompression or decoding operations prior to execution). Codes of the software module referred to herein may be stored, partially or fully, on a storage device of the executing computing device, for being applied in operations of the computing device. Software instructions may be embedded in a firmware, such as EPROM. Obviously, the hardware module may include logic units connected together, such as gates and flip-flops, and/or programmable units, such as programmable gate arrays or processors. The module or computing device functionality described herein may be implemented as software module preferably, but may be also represented in hardware or firmware. In general, the module described herein refers to logical module that that is not restricted by concrete physical states or the storage. One module may be combined with other modules or divided into a sequence of sub-modules.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The above is illustration of the present disclosure and should not be construed as making limitation thereto. Although some exemplary embodiments of the present disclosure have been described, a person skilled in the art can easily understand that many modifications may be made to these exemplary embodiments without departing from the creative teaching and advantages of the present disclosure. Therefore, all such modifications are intended to be included within the scope of the present disclosure as defined by the appended claims. As will be appreciated, the above is to explain the present disclosure, it should not be constructed as limited to the specific embodiments disclosed, and modifications to the present disclosure and other embodiments are included in the scope of the attached claims. The present disclosure is defined by the claims and their equivalents.

What is claimed is:

1. A method for determining electrical characteristics of a transistor, comprising:
   determining mobility characteristics of carriers in channels of the transistor at a transistor operating temperature condition; and
   determining electrical characteristics of the transistor, based on the mobility characteristics of the carriers, semiconductor material properties of the transistor, and structural features of the transistor,
   wherein determining mobility characteristics of carriers in channels of the transistor at a transistor operating temperature condition comprises:
   determining a static carrier mobility ratio in the transistor based on material properties of the transistor under the transistor operating temperature condition; and
   determining a field effect mobility ratio of the carriers based on the static carrier mobility ratio and an activation energy of material of the transistor,
   the field effect mobility ratio of the carriers is:

$$\mu(T) = \mu_0 \times \exp\left[-E_n\left(\frac{1}{k_B T} - \frac{1}{k_B T_0}\right)\right]$$

where $\mu_0$ is the static carrier mobility ratio, and $E_a$ is the activation energy.

2. The method of claim 1, wherein determining mobility characteristics of carriers in channels of the transistor at a transistor operating temperature condition comprises:
   determining a distribution of trap states within an energy gap in semiconductor material of the transistor at the transistor operating temperature condition; and
   determining a carrier concentration in channels of the transistor based on the distribution of trap states within the energy gap.

3. The method of claim 2, wherein the distribution of trap states within the energy gap satisfies a Gaussian distribution, and the carrier concentration in channels of the transistor is:

$$n = \int_{-\infty}^{+\infty} \frac{N}{\sqrt{2\pi\sigma^2}} \exp\left(\frac{-E^2}{2\sigma^2}\right) f(E) dE$$

where N is a total density of trap states within the energy gap, $\sigma$ is an energy disorder parameter of material of the transistor, E is an energy of energy carriers, and f(E) is an occupancy probability of the carriers at the energy E.

4. The method of claim 3, wherein the occupancy probability of the carriers at the energy E is in conformity with a Fermi-Dirac distribution, the carrier concentration in channels of the transistor is:

$$n = n_0 \exp\left[\frac{q(\varphi - V_{ch})}{k_B T}\right]$$

where $n_0$ is a carrier concentration away from contact surface of a semiconductor insulating layer, $\varphi$ is a potential distribution perpendicular to a channel direction, $V_{ch}$ is a potential distribution along the channel direction, $k_B$ is a Boltzmann constant, and T is a temperature.

5. The method of claim 1, wherein determining electrical characteristics of the transistor based on the mobility characteristics of the carriers, semiconductor material properties of the transistor, and structural features of the transistor comprises:
   determining an electric field distribution of the transistor perpendicular to a channel direction according to the carrier concentration; and
   determining a surface charge distribution in channels of the transistor according to the electric field distribution of the transistor perpendicular to the channel direction.

6. The method of claim 5, wherein the electric field distribution of the transistor perpendicular to the channel direction is:

$$F_x(\varphi_x, V_{ch}) = \sqrt{\frac{2k_B T}{\varepsilon_s} n_0 \left[\exp\left(-\frac{qV_{ch}}{k_B T}\right)\left(\exp\left(\frac{q\varphi_x}{k_B T}\right) - 1\right)\right]}^{1/2}$$

where $k_B$ is a Boltzmann constant, T is a temperature, $\varepsilon_s$ is a dielectric constant of a semiconductor layer, q is an electric quantity of a unit charge, $\varphi_x$ is a potential distribution perpendicular to a channel direction, and $V_{ch}$ is a potential distribution along the channel direction.

7. The method of claim 6, wherein the charge distribution in channels of the transistor is:

$$Q_s = -\varepsilon_s F_s = -\sqrt{2k_B T \varepsilon_s n_0} \left[\exp\left(-\frac{qV_{ch}}{k_B T}\right)\left(\exp\left(\frac{q\varphi_x}{k_B T}\right) - 1\right)\right]^{1/2}.$$

8. The method of claim 7, wherein determining electrical characteristics of the transistor based on the mobility characteristics of the carriers, semiconductor material properties of the transistor, and structural features of the transistor comprises:
determining a relationship of how a drain current of the transistor changes as a function of a gate voltage, according to the mobility of the carriers, the charge distribution in channels of the transistor, and the structural features of the transistor.

9. The method of claim 8, wherein the structural features of the transistor comprise a channel width and a channel length of the transistor, the relationship of how the drain current of the transistor changes as a function of the gate voltage is:

$$I_{ds} = \frac{W}{L}\int_{V_s}^{V_d} \mu|Q_s|dV_{ch} = \frac{W}{L}\mu(T)\left[-\frac{2k_BT}{q}(Q_{Sd}-Q_{Ss}) + \frac{1}{2C_{ox}}(Q_{Sd}^2 - Q_{Ss}^2)\right]$$

where W is a channel width, L is a channel length, $V_d$ is a drain voltage, and $V_s$ is a source voltage, and
where $Q_{Ss}=-C_{ox}(V_g-V_{fb}-V_s)$, $Q_{Sd}=-C_{ox}(V_g-V_{fb}-V_d)$, $C_{ox}$ is a capacitance per unit area of the insulating layer of the transistor, and $V_{fb}$ is a flat band voltage.

10. The method of claim 9, wherein determining electrical characteristics of the transistor based on the mobility characteristics of the carriers, semiconductor material properties of the transistor, and structural features of the transistor further comprises:
when the gate voltage of the transistor is in a sub-threshold zone, a relationship of how the drain current of the transistor changes as a function of the gate voltage of the transistor is determined according to contact resistances among a source, a drain, and semiconductor material of the transistor.

11. The method of claim 10, wherein when the gate voltage of the transistor is in the sub-threshold zone, the relationship of the drain current of the transistor changes as a function of the gate voltage of the transistor is:

$$I_{sub} = \frac{W}{L}C_{ox}\mu_{sub}\left(\frac{k_BT}{q}\right)^2 \exp\frac{q(V_{gs}-V_{fb})}{\eta k_BT}\left(1-\exp\frac{-qV_{ds}}{\eta k_BT}\right)$$

where $\mu_{sub}$ is a carrier mobility ratio in the sub-threshold zone of the transistor.

12. The method of claim 1, wherein the semiconductor material of the transistor is organic material.

13. The method of claim 1, wherein the transistor is a coplanar thin film transistor.

14. A non-transitory computer-readable storage medium having stored thereon instructions that, when executed by a computer, cause a computer to perform the method of claim 1.

15. An apparatus for determining electrical characteristics of a transistor, the apparatus comprising:
an input module configured to receive an input of parameters for determining electrical characteristics of the transistor, wherein the parameters including semiconductor material properties of the transistor, structural features of the transistor, and a temperature;
a memory having stored thereon processor-readable instructions;
a processor configured to, when executing the instructions, cause the apparatus to perform the method of claim 1 and obtain a determination result of electrical characteristics of the transistor; and
an output module configured to output the determination result of electrical characteristics of the transistor.

* * * * *

UNITED STATES PATENT AND TRADEMARK OFFICE
CERTIFICATE OF CORRECTION

PATENT NO. : 11,536,763 B2  
APPLICATION NO. : 16/344634  
DATED : December 27, 2022  
INVENTOR(S) : Jiangnan Lu and Hongge Li Page 1 of 1

It is certified that error appears in the above-identified patent and that said Letters Patent is hereby corrected as shown below:

On the Title Page

Item (73) the Assignee name:  
BOE TECHNOLOGY GROUP CO., LTD. Beijing (CN)

Is changed to:  
BOE TECHNOLOGY GROUP CO., LTD. Beijing (CN)  
BEIHANG UNIVERSITY Beijing (CN)

Signed and Sealed this  
Fifth Day of March, 2024

Katherine Kelly Vidal  
*Director of the United States Patent and Trademark Office*